United States Patent
Yamamoto

(10) Patent No.: US 6,518,142 B2
(45) Date of Patent: Feb. 11, 2003

(54) FABRICATION METHOD FOR MIM CAPACITIVE CIRCUIT HAVING LITTLE LEAKAGE CURRENT

(75) Inventor: Tomoe Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/768,145

(22) Filed: Jan. 24, 2001

(65) Prior Publication Data

US 2001/0023109 A1 Sep. 20, 2001

(30) Foreign Application Priority Data

Jan. 26, 2000 (JP) ..................................... 2000-017188

(51) Int. Cl.[7] .............................................. H01L 21/20
(52) U.S. Cl. ........................ 438/396; 438/253; 438/756
(58) Field of Search ................................. 438/396, 397, 438/398, 253, 254, 255, 3, 240, 745, 756

(56) References Cited

U.S. PATENT DOCUMENTS 6,162,738 A * 12/2000 Chen et al. .................... 134/2

FOREIGN PATENT DOCUMENTS

| JP | 10-12836    | 1/1998 |
|----|-------------|--------|
| JP | 2000-124423 | 4/2000 |
| JP | 2001-203330 | 7/2001 |

* cited by examiner

Primary Examiner—Tuan H. Nguyen
(74) Attorney, Agent, or Firm—Sughrue Mion, PLLC

(57) ABSTRACT

When fabricating an MIM capacitive circuit in which a lower electrode and an upper electrode confront each other through a capacitive film, the lower electrode composed of titanium nitride (TiN), which is a metal that is resistant to oxidation by sulfuric acid, is formed on a substrate, following which the surface of this lower electrode is cleaned with a solution containing sulfuric acid, preferably, dilute sulfuric acid. A capacitive film composed of the dielectric material tantalum oxide ($Ta_2O_5$) is then formed on the surface of the cleaned lower electrode, following which an upper electrode composed of the metal titanium nitride (TiN) is formed on the surface of the capacitive film. Cleaning with dilute sulfuric acid eliminates the presence of organic material or oxide material on the surface of the lower electrode, thereby preventing leakage current that is caused by these materials.

4 Claims, 8 Drawing Sheets

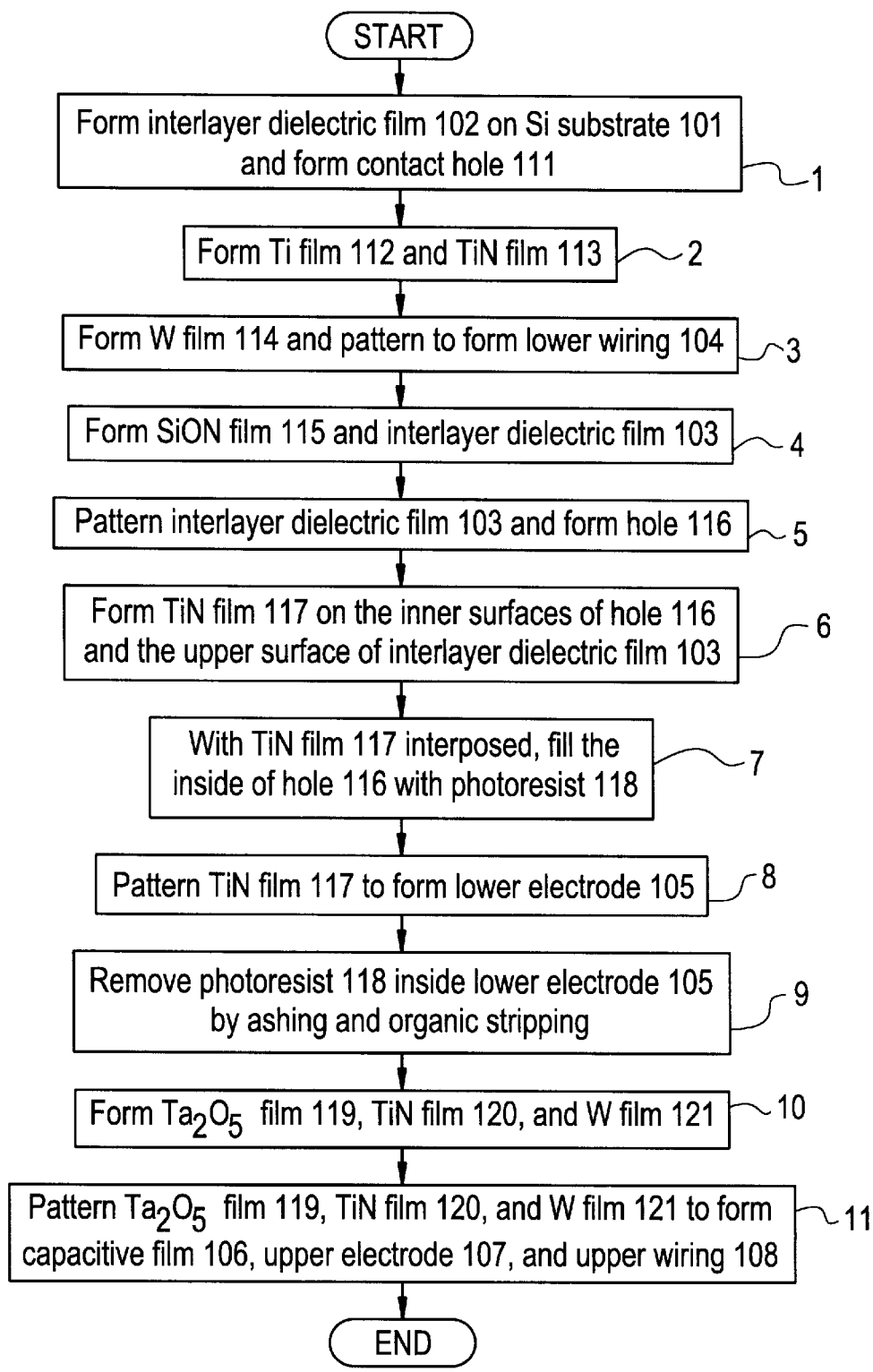

FABRICATION METHOD FOR MIM CAPACITIVE CIRCUIT HAVING LITTLE LEAKAGE CURRENT

BACKGROUND OF THE INVENTION

1. Field of the Invention

The present invention relates to a method of fabricating a MIM (Metal-Insulator-Metal) capacitive circuit in which a lower electrode and an upper electrode confront each other through a capacitive film.

2. Description of the Related Art

Circuits that are currently in use have a variety of configurations according to various purposes. For example, capacitive circuits are used to temporarily hold voltage. These capacitive circuits also have a variety of constructions, one example being the MIM capacitive circuit, which is a micro capacitive circuit that employs thin-film technology. In this circuit, a lower electrode and an upper electrode confront each other through a capacitive film. The lower electrode, the capacitive film, and the upper electrode can be micro-formed by employing thin-film technology.

Referring now to FIG. 1A to FIG. 6, one example of this type of MIM capacitive circuit of the prior art will be described. FIG. 1A to FIG. 5B are process figures showing the progression of fabrication steps of a MIM capacitive circuit, and FIG. 6 is a flow chart of this process.

As shown in FIG. 5B, prior-art MIM capacitive circuit 100 that is here taken as an example includes silicon substrate 101 and interlayer dielectric films 102 and 103 that are composed of the dielectric material silicon dioxide ($SiO_2$) and that are formed on the surface of this silicon substrate 101.

Lower wiring 104 composed of the metal tungsten (W) is embedded in lower interlayer dielectric film 102, and lower electrode 105 composed of the metal titanium nitride (TiN) is embedded in upper interlayer dielectric film 103. This lower electrode 105 is formed in a concave shape, and lower wiring 104 is connected to its lower surface.

Capacitive film 106 composed of the dielectric material tantalum oxide ($Ta_2O_5$) is layered on the surface of lower electrode 105, and upper electrode 107 composed of titanium nitride (TiN) is layered on the surface of capacitive film 106. Upper wiring 108 is connected to the upper surface of upper electrode 107, and upper wiring 108 and lower wiring 104 are connected to an external circuit (not shown in the figures).

In MIM capacitive circuit 100 of the above-described construction, conductive lower electrode 105 and upper electrode 107 confront each other through dielectric capacitive film 106, and MIM capacitive circuit 100 is thus able to hold charge in this portion.

Next, regarding the circuit fabrication method for fabricating MIM capacitive circuit 100 of the above-described construction, interlayer dielectric film 102 composed of a silicon dioxide ($SiO_2$) film is firstly formed to a thickness of 0.7 μm on the surface of silicon substrate 101 in Step 1, as shown in FIG. 1A. This interlayer dielectric film 102 is then patterned by, for example, a photolithographic technique and contact hole 111 is then formed to reach as far as the surface of silicon substrate 101.

In Step 2, titanium film 112 is formed to a thickness of 100 Å on the bottom surface of contact hole 111 and the upper surface of interlayer dielectric film 102 by a CVD (Chemical Vapor Deposition) method, as shown in FIG. 1B. Titanium nitride film 113 is further grown to a thickness of 100 Å by a CVD method on the inner surfaces of contact hole 111 and on titanium film 112 on the upper surface of interlayer dielectric film 102.

Alternatively, titanium film 112 having a thickness of 300 Å may be formed by a PVD (Physical Vapor Deposition) method on the inner surfaces of contact hole 111 and on the upper surface of interlayer dielectric film 102, following which titanium nitride film 113 is grown to a thickness of 500 Å.

Next, in Step 3, tungsten (W) film 114 having a thickness of 400 Å is formed by a CVD method on the surface of titanium nitride film 113 as shown in FIG. 1C. At this time, tungsten film 114 is formed thicker in some portions such that tungsten film 114 fills the inside of contact hole 111. Then, as shown in FIG. 1D, tungsten film 114, titanium nitride film 113, and titanium film 112 are removed only above interlayer dielectric film 102 by a CMP (Chemical Mechanical Polishing) method, thus completing the formation of lower wiring 104.

Next, in Step 4, SiON film 115 having a thickness of 500 Å and interlayer dielectric film 103 composed of silicon dioxide ($SiO_2$) and having a thickness of 1.5 μm are successively formed by plasma CVD method on the upper surface of interlayer dielectric film 102 that has been leveled by the CMP method, as shown in FIG. 2A. Then, in Step 5, upper interlayer dielectric film 103 is patterned by, for example, a photolithographic process, and wide hole 116 is formed as far as lower interlayer dielectric film 102 and the upper surface of lower wiring 104 as shown in FIG. 2B.

In Step 6, titanium nitride (TiN) film 117 having a thickness of 100 Å to 300 Å is grown by a CVD method on the inside surfaces of this hole 116 and the upper surface of interlayer dielectric film 103 as shown in FIG. 2C. In Step 7, the inside of hole 116 is next filled by photoresist 118 with titanium nitride film 117 interposed as shown in FIG. 3A.

As one example of the conditions of the CVD method for growing titanium nitride film 117, the rates of flow of reaction gases $TiCl_4$, $NH_3$, $N_2$ are 10 to 40 sccm (standard cc/min), 100 to 600 sccm, and 500 sccm, respectively; the pressure is 0.3 torr, and the temperature is 600° C.

In Step 8, titanium nitride film 117 is etched only above interlayer dielectric film 103 without removing photoresist 118, as shown in FIG. 3B, thus forming lower electrode 105 in a concave shape. In Step 9, photoresist 118 inside this lower electrode 105 is removed by ashing and organic stripping as shown in FIG. 3C.

As one example of the conditions of this ashing, the rates of flow of reaction gases $O_2$ and $N_2$ are 1000 to 3000 sccm and 100 to 200 sccm, respectively, the pressure is 1 to 5 torr, the temperature is 200 to 300° C., and the electrical power is 1000 W. In addition, the organic stripping carried out in this case is a process in which, after removing photoresist 118 by ashing, deposition or residual photoresist 118 is removed by a mixed aqueous solution of dimethyl sulfoxide and ammonium fluoride. Next, in Step 10, tantalum oxide ($Ta_2O_5$) film 119 having a thickness of 50 to 200 Å, titanium nitride (TiN) film 120 having a thickness of 100 to 300 Å, and tungsten (W) film 121 having a thickness of 1000 Å are successively grown by a CVD method on the inner surfaces of lower electrode 105 and the upper surface of interlayer dielectric film 103 as shown in FIG. 4A, FIG. 4B, and FIG. 5A.

As one example of the conditions of the CVD method for growing tantalum oxide film 119, the flow rates of the reaction gases Ta(OC$_2$H$_5$)$_5$ and O$_2$ are 0.1 sccm and 2000 sccm respectively, the pressure is 0.5 torr, and the temperature is 450° C. As one example of the conditions of the CVD method for growing titanium nitride film 120, the reaction gas is TDMAT (tetrakis-dimethylamino-titanium) from an organic source at a pressure of 1.5 torr and a temperature of 450° C.

In Step 11, capacitive film 106, upper electrode 107, and upper wiring 108 are formed as shown in FIG. 5B by patterning tantalum oxide film 119, titanium nitride film 120 and tungsten film 121 that overlie interlayer dielectric film 103 to the same shape by using, for example, a photolithographic process.

Conductive lower electrode 105 and upper electrode 107 confront each other through dielectric capacitive film 106, and MIM capacitive circuit 100 of the above-described construction therefore can hold a charge in this portion. When the inventors of this invention actually constructed MIM capacitive circuit 100 of the above-described configuration on an experimental basis, however, they confirmed that a leakage current occurred at a level that could not be ignored.

As the cause of this leakage current, it was presumed that organic material adhered to, or that an oxide material occurred on the surface of lower electrode 105, which is composed of titanium nitride. It was further presumed that this adherence of organic material and occurrence of organic material result from the removal by ashing and organic stripping of photoresist 118 that was applied to the surface of lower electrode 105.

In Japanese Patent Laid-open No. 12836/98, for example, titanium nitride is disclosed as one electrode material of an MIM capacitive circuit, and it is further disclosed that the surface of this electrode is cleaned. It is further disclosed that this cleaning is carried out by a solution containing at least one of water, hydrochloric acid, nitric acid, hydrofluoric acid, and organic solvent. However, it was confirmed that the occurrence of a leakage current could not be sufficiently prevented even when capacitive film 106 was grown after leaning the surface of lower electrode 105 with this type of solution.

SUMMARY OF THE INVENTION

It is an object of the present invention to provide a method of fabricating an MIM capacitive circuit having a lower leakage current than the prior art.

As the feature of the present invention, when fabricating an MIM capacitive circuit in which a lower electrode and upper electrode confront each other through a capacitive film, the capacitive film is formed after cleaning the surface of the lower electrode following formation of the lower electrode. The lower electrode is composed of a metal that is resistant to oxidation by sulfuric acid, and the solution for cleaning is a solution that contains sulfuric acid. The capacitive film is composed of a dielectric material, and the upper electrode is composed of a metal.

The occurrence or adherence of organic material or oxide material on the surface of the lower electrode can be suppressed by forming the capacitive film after cleaning the surface of the lower electrode with a solution that contains sulfuric acid, thereby enabling the suppression of leakage current between the lower electrode and upper electrode.

The lower electrode is preferably composed of a metal that is principally at least one of: titanium nitride, ruthenium, ruthenium oxide, tungsten nitride, tungsten, and tantalum nitride. In addition, the solution for cleaning is preferably a dilute sulfuric acid. The above and other objects, features, and advantages of the present invention will become apparent from the following description with reference to the accompanying drawings which illustrate an example of the present invention.

BRIEF DESCRIPTION OF THE DRAWINGS:

FIG. 6 is a flow chart showing the circuit fabrication method of an MIM capacitive circuit of the prior art.

DETAILED DESCRIPTION OF THE PREFERRED EMBODIMENT

Figure 1A:
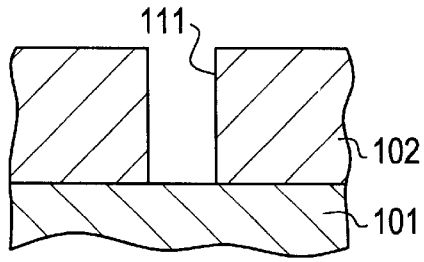
FIGS. 1A to 1D are process diagrams showing the circuit fabrication method of an MIM capacitive circuit.
Figure 1B:
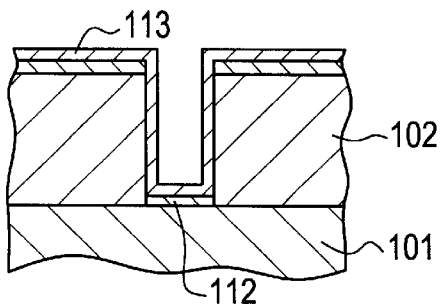
Figure 1C:
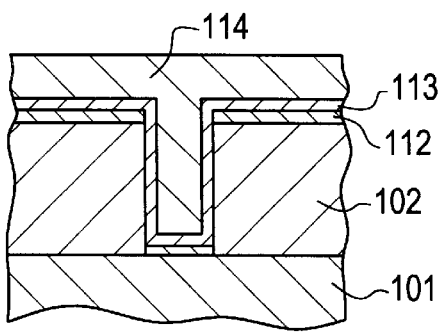
Figure 1D:
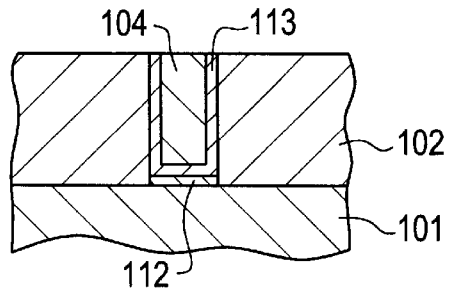
Figure 2A:
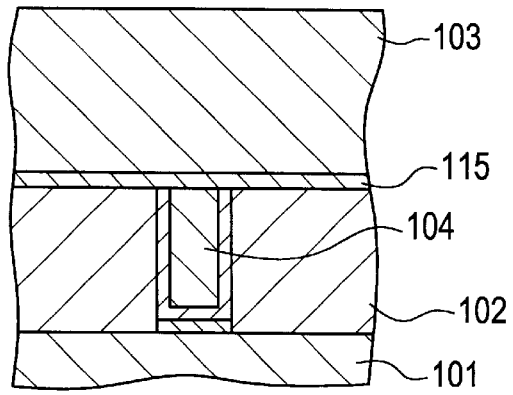
FIGS. 2A to 2C are process diagrams showing the circuit fabrication method of an MIM capacitive circuit.
Figure 2B:
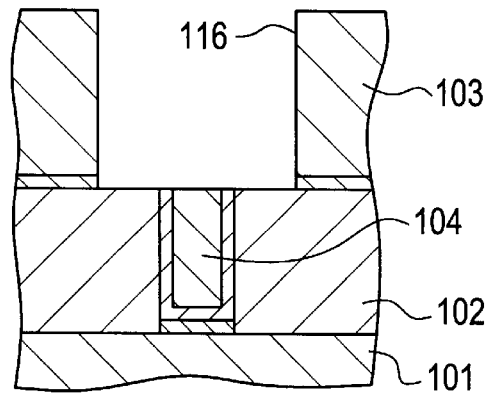
Figure 2C:
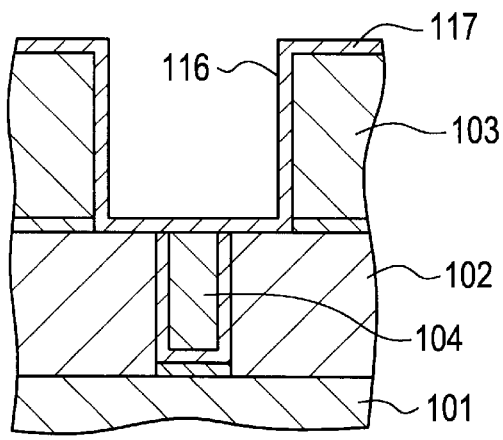

In the explanation of the present embodiment, parts that are identical to the previously described example of the prior art are identified with the same name and the same reference numeral and detailed description is omitted.

Figure 3A:
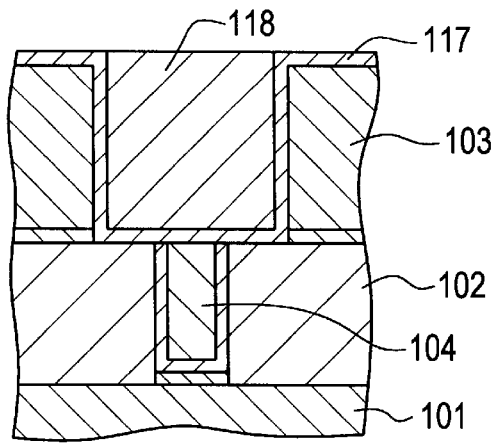
FIGS. 3A to 3C are process diagrams showing the circuit fabrication method of an MIM capacitive circuit.
Figure 3B:
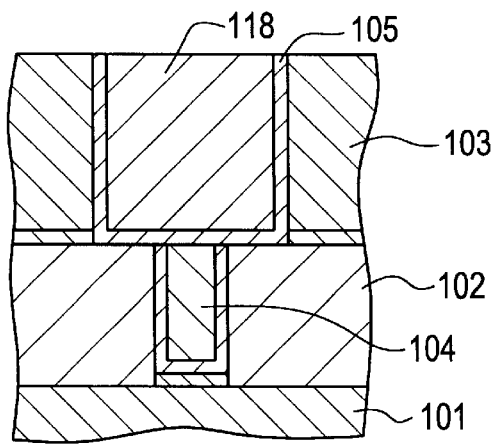
Figure 3C:
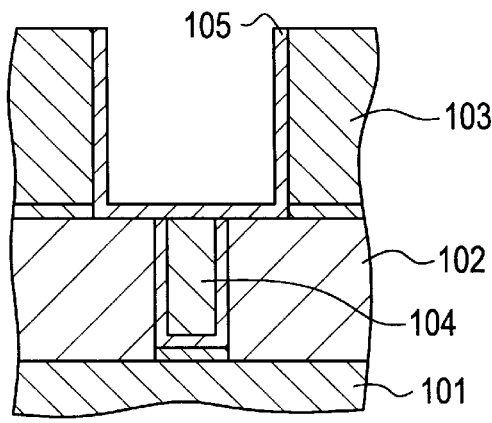
Figure 4A:
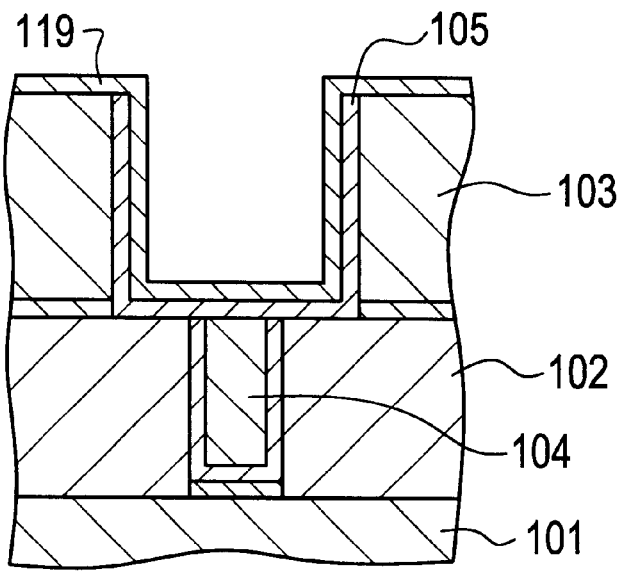
FIGS. 4A to 4B are process diagrams showing the circuit fabrication method of an MIM capacitive circuit.
Figure 4B:
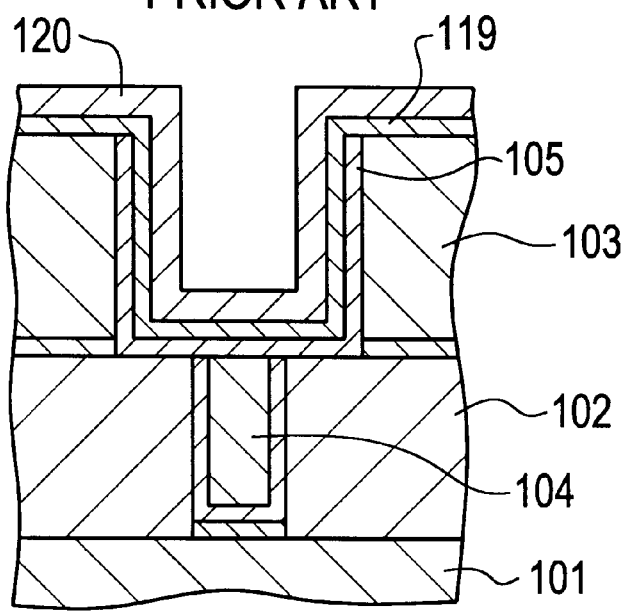
Figure 5A:
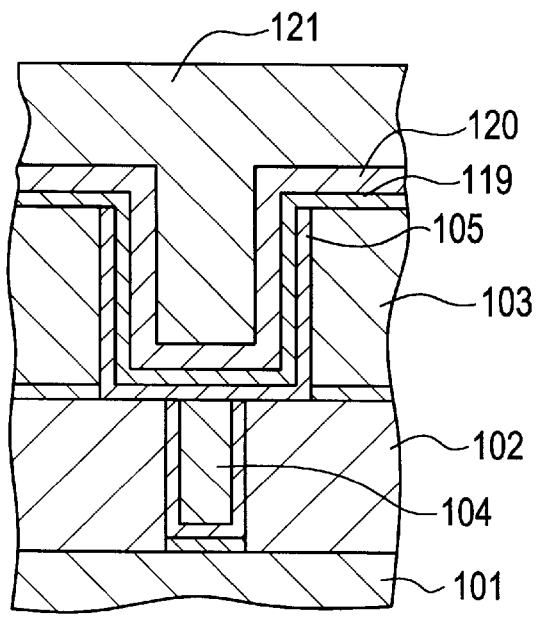
FIGS. 5A to 5B are process diagrams showing the circuit fabrication method of an MIM capacitive circuit.
Figure 5B:
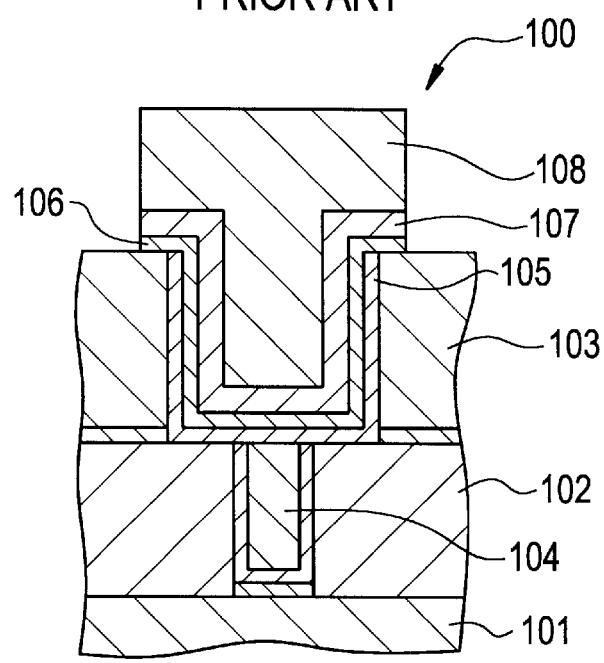

The configuration of MIM capacitive circuit 100 of this embodiment is identical to that of the prior art, but the method of fabricating the circuit differs in part from that of the prior art. Essentially, in the method of fabricating the MIM capacitive circuit of this embodiment, the surface of lower electrode 105 is cleaned in Step 12 by a dilute sulfuric acid, which is a solution containing sulfuric acid, after the removal by ashing and organic stripping of photoresist 118 that was applied to the inside surface of lower electrode 105 that is composed of titanium nitride (Refer to FIG. 3B and FIG. 3C) in Step 9 and before growing tantalum oxide (Ta$_2$O$_5$) film 119, which becomes capacitive film 106 (Refer to FIG. 4A) in Step 10. Thus, cleaning the surface of lower electrode 105, which is composed of titanium nitride, with this dilute sulfuric acid enables effective removal of the organic material and oxide material that occurs on the surface of lower electrode 105 due to removal of photoresist 118 after its application. Accordingly, a large leakage current does not occur in MIM capacitive circuit 100 that is formed by layering capacitive film 106 on this lower electrode 105.

To confirm the above-described effect, the inventors of the present invention measured actual leakage currents using a MIM capacitive circuit that was produced by the prior-art fabrication method and an MIM capacitive circuit that was produced by the fabrication method of this invention.

In concrete terms, samples in which titanium nitride film, tantalum oxide (Ta$_2$O$_5$) film, and metal film are layered on a silicon substrate were produced in large numbers. A tantalum oxide (Ta$_2$O$_5$) film was layered on approximately half of the samples without cleaning the surface of the titanium nitride film with dilute sulfuric acid, as in the prior art; and a tantalum oxide (Ta$_2$O$_5$) film was layered on the other samples after cleaning the surface of the titanium nitride film with dilute sulfuric acid.

Figure 7:
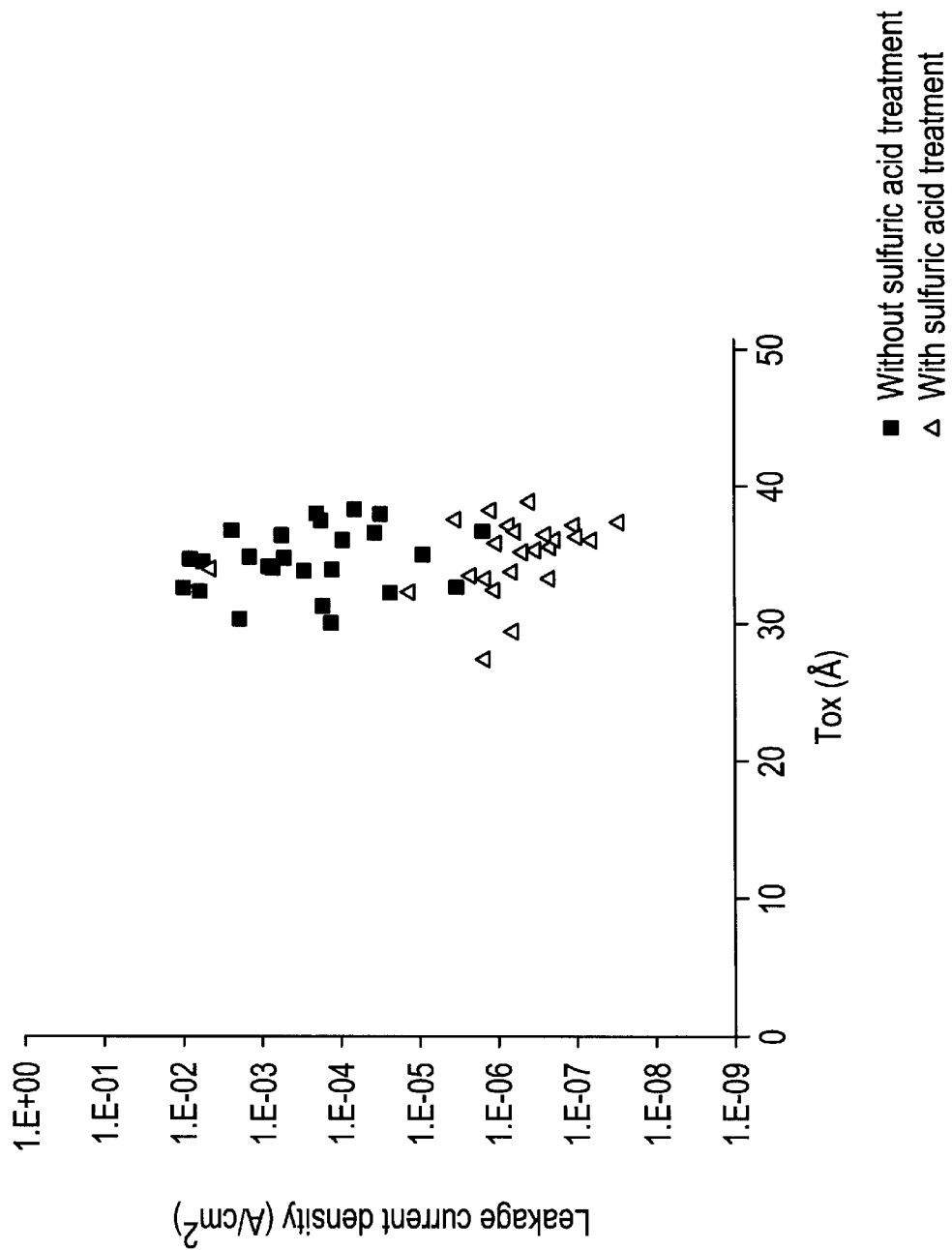
FIG. 7 is a characteristics chart showing leakage current densities of samples of an MIM capacitive circuit.
Figure 8:
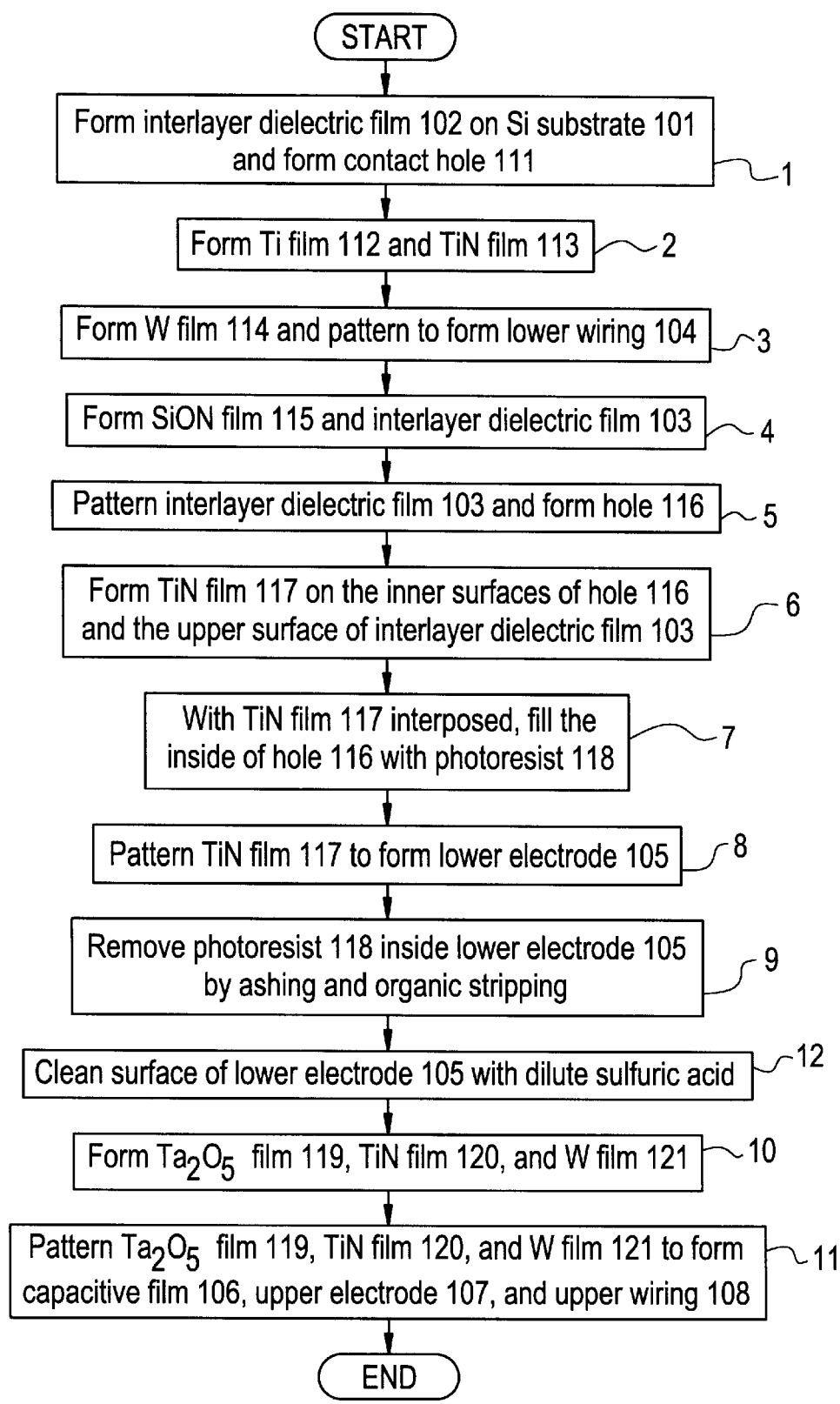
FIG. 8 is a flow chart showing the circuit fabrication method of an MIM capacitive circuit of the present invention.

Leakage current was then measured between the lower surface of the silicon substrate and the upper surface of the metal film in these two types of samples. As shown in FIG. 7, it was confirmed that samples in which the surface of the titanium nitride film was cleaned with dilute sulfuric acid (the MIM capacitive circuit of the present invention) had far less leakage current and could more effectively ensure capacitance than samples in which cleaning with dilute sulfuric acid was not carried out (the MIM capacitive circuit of the prior art). In FIG. 7, the vertical axis corresponds to the current density, and the horizontal axis corresponds to the reciprocal of the capacitance.

Since sulfuric acid generally oxidizes metal, it is generally regarded as unsuitable for cleaning metal. The previously mentioned Japanese Patent Laid-open No. 12836/98 discloses only water, hydrochloric acid, nitric acid, hydrofluoric acid and organic solvent as the materials of the solution for cleaning the surface of the electrode. When the inventors of the present invention cleaned the surface of the titanium nitride film with sulfuric acid, however, it was confirmed that the organic material and oxide material were effectively removed and the titanium nitride did not oxidize despite cleaning by sulfuric acid.

The present invention is not limited to this embodiment and permits various modifications within a scope that does not deviate the spirit of the invention. For example, although titanium nitride, a metal that is relatively impervious to oxidation by sulfuric acid, was taken as the example of the material for lower electrode 105 in this embodiment, any material may be used that is a metal that is relatively impervious to oxidation by sulfuric acid, and any metal may be substituted that takes as a principal constituent at least one of: ruthenium, ruthenium oxide, tungsten nitride, tungsten, and tantalum nitride.

While a preferred embodiment of the present invention has been described using specific terms, such description is for illustrative purposes only, and it is to be understood that changes and variations may be made without departing from the spirit or scope of the following claims.

What is claimed is:

1. A method of fabricating an MIM (Metal-Insulator-Metal) capacitive circuit in which a lower electrode and an upper electrode confront each other through a capacitive film, comprising the steps of:

forming a lower electrode from a metal including TiN which surface is oxidized during lower electrode etching step;

eliminating the oxidized surface of said lower electrode with a solution that contains sulfuric acid;

forming a capacitive film from a dielectric material on the surface of said lower electrode that has been cleaned; and forming an upper electrode from a metal on the surface of said capacitive film.

2. A method of fabricating an MIM capacitive circuit according to claim 1 wherein said lower electrode is formed from a metal that is principally at least one of: titanium nitride, ruthenium, ruthenium oxide, tungsten nitride, tungsten, and tantalum nitride.

3. A method of fabricating an MIM capacitive circuit according to claim 1 wherein said solution is dilute sulfuric acid.

4. A method of fabricating an MIM capacitive circuit according to claim 2 wherein said solution is dilute sulfuric acid.

* * * * *